United States Patent
Malisic et al.

(10) Patent No.: US 11,430,536 B2
(45) Date of Patent: Aug. 30, 2022

(54) SOFTWARE-FOCUSED SOLUTION FOR ARBITRARY ALL-DATA ODD SECTOR SIZE SUPPORT

(71) Applicant: Advantest Corporation, Tokyo (JP)

(72) Inventors: Srdjan Malisic, San Jose, CA (US); Chi Albert Yuan, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/142,989

(22) Filed: Jan. 6, 2021

(65) Prior Publication Data

US 2021/0125680 A1 Apr. 29, 2021

Related U.S. Application Data

(63) Continuation-in-part of application No. 16/227,389, filed on Dec. 20, 2018, now Pat. No. 10,976,361.

(60) Provisional application No. 62/983,118, filed on Feb. 28, 2020.

(51) Int. Cl.
  *G11C 29/38* (2006.01)
  *G11C 29/14* (2006.01)

(52) U.S. Cl.
  CPC .............. *G11C 29/38* (2013.01); *G11C 29/14* (2013.01)

(58) Field of Classification Search
  CPC . G11C 29/38; G11C 29/14; G11C 2029/5602; G11C 29/56
  USPC ........................................................ 324/652
  See application file for complete search history.

(56) References Cited

U.S. PATENT DOCUMENTS

| 6,567,941 B1* | 5/2003 | Turnquist ............... G11C 29/56 714/724 |
| 6,757,845 B2 | 6/2004 | Bruce |
| 7,302,358 B2 | 11/2007 | Fritzsche |
| 7,362,089 B2 | 4/2008 | Kushnick et al. |
| 2003/0005180 A1* | 1/2003 | Schmit ...................... G06F 8/71 718/100 |
| 2007/0022323 A1 | 1/2007 | Loh et al. |
| 2007/0192661 A1 | 8/2007 | Chang et al. |

(Continued)

FOREIGN PATENT DOCUMENTS

| CN | 1719786 | 1/2006 |
| CN | 108777158 | 11/2018 |
| JP | 2018060575 A | 4/2018 |

OTHER PUBLICATIONS

Pang, Fang, et al. "A reconfigurable digital IC tester implemented using the ARM integrator rapid prototyping system." Canadian Conference on Electrical and Computer Engineering 2004 (IEEE Cat. No. 04CH37513). vol. 4. IEEE, 2004. (Year: 2004).*

(Continued)

*Primary Examiner* — Christopher P McAndrew

(57) ABSTRACT

An automated test equipment (ATE) system comprises a computer system comprising a system controller, wherein the system controller is communicatively coupled to a tester processor, wherein the system controller is operable to transmit instructions to the tester processor. The tester processor is operable to generate commands and data from the instructions for coordinating testing of a device under test (DUT), wherein the DUT supports an arbitrary sector size, and wherein software layers on the tester processor perform computations to be able control data flow between the tester processor and sectors of arbitrary size in the DUT.

19 Claims, 14 Drawing Sheets

(56) References Cited

U.S. PATENT DOCUMENTS

| | | | | |
|---|---|---|---|---|
| 2008/0312857 A1* | 12/2008 | Sequine | ................ | G01D 5/241 |
| | | | | 702/65 |
| 2009/0009195 A1* | 1/2009 | Seguine | ................... | G01D 5/24 |
| | | | | 324/690 |
| 2009/0019429 A1* | 1/2009 | Randow | .............. | G06F 11/3664 |
| | | | | 717/130 |
| 2009/0140728 A1* | 6/2009 | Rollins | ................. | G01B 7/023 |
| | | | | 324/207.16 |
| 2012/0079194 A1 | 3/2012 | Lim | | |
| 2015/0077094 A1* | 3/2015 | Baldwin | ............... | G01B 7/003 |
| | | | | 324/207.17 |
| 2016/0305997 A1* | 10/2016 | Wiesbauer | ............ | G01L 9/0072 |
| 2017/0023429 A1* | 1/2017 | Straeussnigg | ........... | G01L 19/00 |
| 2017/0155659 A1* | 6/2017 | Baltar | ................... | H04L 63/105 |

OTHER PUBLICATIONS

Viavi. Medusa Labs Test Tool Suite 7,2. Article. 4 pp. 2016 Viavi Solutions Inc. viavisolutions.com.

* cited by examiner

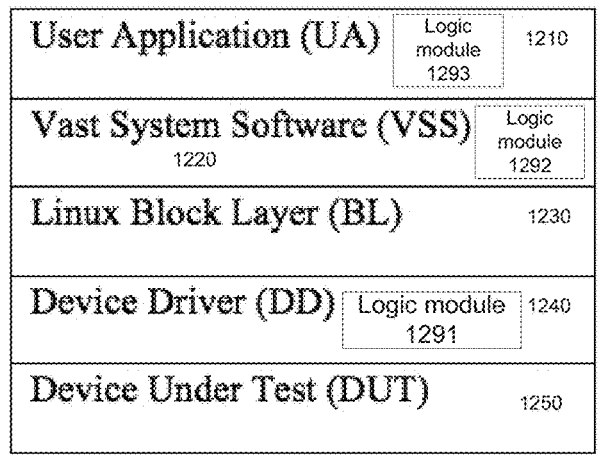

FIG. 12 A

| User Application (UA) 1210 | Knows device is 524 bytes per sector, it requests data from 100 sectors. |
|---|---|
| Vast System Software (VSS) 1220 | Knows that to meet data length requested, with limitation of Linux block layer, it requests for 103 sectors. |
| Linux Block Layer (BL) 1230 | Knows device is 512 bytes per sector, check requested length meets its limitation of multiple of 512 bytes, allow request to pass down and data to go up |
| Device Driver (DD) 1240 | Knows device is 524 bytes per sector. It calculated and sends command to get 100 sectors. |
| DUT 1250 | DUT sees the command and fulfill the request from the device driver layer. |

Communicatively Couple a Host Controller to A Tester Processor and an FPGA
1310

Select an Acceleration Mode for Generating Commands and Data for Testing a a DUT connected to the FPGA, where the acceleration mode selected is a mode wherein the tester process generates the commands and the data
1312

Generate a command by the tester processor associated with the DUT, wherein the DUT comprises an arbitrary sector size
1314

Determine, at a Vast System Software (VSS) layer, the nearest sector size supported by a Linux block layer and transmit a request to the Linux block layer for the number of blocks requested by the tester processor including an additional number of blocks for the additional bytes per block
1316

At the Linux block layer, determine if the requested length of information meets a limitation of processing data associated with the Linux block layer and pass down the request to the device driver layer
1318

Determine the number of sectors to be accessed from the DUT and transmit a request to the DUT
1320

Receiving information from the determined number of sectors from the DUT and performing a compare operation to test the DUT
1322

```
┌─────────────────────────────────────────────────┐
│ Communicatively Couple a Host Controller to A Tester │
│         Processor and an FPGA                   │
│                    1410                         │
└─────────────────────────────────────────────────┘
                      ↓
┌─────────────────────────────────────────────────┐
│ Generate a command by the tester processor associated with │
│ the DUT, wherein the DUT comprises an arbitrary sector size │
│                    1412                         │
└─────────────────────────────────────────────────┘
                      ↓
┌─────────────────────────────────────────────────┐
│ Determine, at a Vast System Software (VSS) layer, the │
│   nearest sector size supported by a Linux block layer and │
│   transmit a request to the Linux block layer for the number of │
│   blocks requested by the tester processor including an │
│   additional number of blocks for the additional bytes per block │
│                    1414                         │
└─────────────────────────────────────────────────┘
                      ↓
┌─────────────────────────────────────────────────┐
│ At the Linux block layer, determine if the requested length of │
│ information meets a limitation of processing data associated │
│ with the Linux block layer and pass down the request to the │
│              device driver layer                │
│                    1416                         │
└─────────────────────────────────────────────────┘
                      ↓
┌─────────────────────────────────────────────────┐
│ Determine the number of sectors to be accessed from the │
│       DUT and transmit a request to the DUT     │
│                    1418                         │
└─────────────────────────────────────────────────┘
                      ↓
┌─────────────────────────────────────────────────┐
│ Receiving information from the determined number of sectors │
│ from the DUT and performing a compare operation to test the │
│                     DUT                         │
│                    1420                         │
└─────────────────────────────────────────────────┘
```

FIG. 14

SOFTWARE-FOCUSED SOLUTION FOR ARBITRARY ALL-DATA ODD SECTOR SIZE SUPPORT

CROSS-REFERENCE TO RELATED APPLICATIONS

The present application is a continuation-in-part of U.S. patent application Ser. No. 16/227,389, filed Dec. 20, 2018, entitled "AUTOMATED TEST EQUIPMENT (ATE) SUPPORT FRAMEWORK FOR SOLID STATE DEVICE (SSD) ODD SECTOR SIZES AND PROTECTION MODES" naming Srdjan Malisic, Micahel Jones and Albert Yuan as inventors, filed on Dec. 20, 2018, which is incorporated herein by reference in their entirety and for all purposes.

This application also claims priority to U.S. Provisional Application 62/983,118, titled "SOFTWARE-ONLY SOLUTION FOR ARBITRARY ALL-DATA ODD SECTOR SIZE SUPPORT," filed on Feb. 28, 2020. The entire contents of each of the above-listed applications is hereby incorporated by reference for all purposes as if fully set forth herein.

FIELD OF THE INVENTION

The present disclosure relates generally to the field of electronic device testing systems and more specifically to the field of electronic device testing equipment for testing devices under test (DUTs), e.g., solid state drives (SSDs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram of a conventional automatic test equipment body 100 for testing certain typical DUTs, e.g., a semiconductor memory device such as a DRAM. The ATE includes an ATE body 100 with hardware bus adapter sockets 110A-110N. Hardware bus adapter cards 110A-110N specific to a particular communication protocol e.g. PCIe, USB, SATA, SAS etc., connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs to the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., SATA the user would ordinarily need to replace the PCIe hardware bus adapter cards with bus adapter cards supporting the SATA protocol. Unless the PCIe hardware bus adapter cards are physically substituted with cards supporting the other protocol, such a system can only test DUTs that support the PCIe protocol. Thus, on the test floor, critical time is consumed replacing hardware bus adapter cards when DUTs running a different protocol from the one that the existing adapter cards support need to be tested.

A drawback of conventional tester systems is that these test systems do not presently support testing of DUTs (e.g., SSDs) with odd sector sizes containing all data, e.g., DUTs with odd sector sizes that do not contain any protection information (Non-PI). For example, most of the solid-state drives (SSDs) available on the market are formatted for standard sector sizes, e.g., 4096 bytes per sector, 512 bytes per sector. Most modern hard drives use one of the two standard sector sizes: 512 bytes per sector or 4096 bytes per sector. However, certain vendors also support all-data odd sector sizes, e.g., 520 bytes per sector (BPS) or 528 bytes per sector (BPS) especially for drives to be used in enterprise-grade systems.

These drives have the whole sector size dedicated for user data storage, rather than use the additional size for system usage, like protection information. Every byte of data in each sector, 520 bytes or 528 bytes, is available for the device user to access. The tester system cannot strip additional bytes away like it does with drives with additional bytes for Protection Information (PI). Further, the tester system needs to access all sectors of the drive including the additional bytes of data. Most operating systems cannot handle drives like these. Accordingly, conventional ATE testing on SSDs is limited because it does not support testing of drives with all-data odd sector sizes.

BRIEF SUMMARY OF THE INVENTION

Accordingly, a need exists for a tester architecture that can address the problems with the systems described above. What is needed is a tester system that supports the software level for testing DUTs (e.g., SSDs) comprising all-data odd sector sizes. Additionally, there is a need for a tester system that can handle testing of all-data sector SSDs of any sector size, including non-standard sizes through changes in software. For example, SSDs may have non-standard sector sizes of 520 BPS, 4104 BPS, 528 BPS and 4224 BPS, or even any other arbitrary sector size. What is needed is a tester system that is able to seamlessly and efficiently test SSDs with arbitrary sector sizes where the sectors comprise data.

In one embodiment, an automated test equipment (ATE) system is disclosed. The system comprises a computer comprising a system controller, wherein the system controller is communicatively coupled to a tester processor, wherein the system controller is operable to transmit instructions to the tester processor. The tester processor is operable to generate commands and data from the instructions for coordinating testing of a device under test (DUT), wherein the DUT supports an arbitrary sector size, and wherein software layers on the tester processor perform computations to be able control data flow between the tester processor and sectors of arbitrary size in the DUT.

In another embodiment, a method for testing using an automated test equipment (ATE) comprises transmitting instructions from a system controller of a computer system to a tester processor, wherein the system controller is communicatively coupled to the tester processor. The method also comprises generating commands and data using the tester processor for coordinating testing of a device under test (DUT), wherein the DUT supports a plurality of arbitrary all-data sector sizes, and wherein software layers on the tester processor perform computations to be able control data flow between the tester processor and the plurality of arbitrary all-data sector sizes in the DUT.

Further, what is needed is a test architecture whereby the command and test pattern generation functionality can be transferred onto the FPGA, so that the processing load on the tester processor and the bandwidth requirements on the system bus can be kept at a minimum. Further, what is needed is a test architecture whereby the communicative protocol engine can be programmed on FPGA devices so that the protocol used to communicate with the DUTs is reconfigurable.

In a different embodiment, an automated test equipment (ATE) apparatus comprises a computer system comprising a system controller, wherein the system controller is communicatively coupled to a tester processor and an FPGA wherein the system controller is operable to transmit instructions to the tester processor, and wherein the tester processor is operable to generate commands and data from the instructions for coordinating testing of a device under test (DUT), wherein the DUT supports a plurality of non-standard all-data sector sizes. The FPGA is communicatively coupled to the tester processor, wherein the FPGA comprises at least one hardware accelerator circuit operable to internally generate commands and data transparently from the tester processor for testing the DUT. Further, the tester processor is configured to operate in one of a plurality of functional modes, wherein each functional mode is configured to allocate functionality for generating commands and for generating data between the tester processor and the FPGA in a different manner, and wherein in standard mode, the tester processor is configured to generate all commands and data for coordinating testing of the DUT comprising the plurality of non-standard all-data sector sizes.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 12A illustrates the application layers comprising the software executing on the tester processor in accordance with an embodiment of the present invention.

FIG. 12B illustrates the function of each of the application layers comprising the software executing on the tester processor in accordance with an embodiment of the present invention.

FIG. 13 depicts a flowchart of an exemplary computer implemented process of testing DUTs supporting arbitrary sector sizes according to an embodiment of the present invention.

FIG. 14 depicts a flowchart of an exemplary computer implemented process of testing DUTs supporting arbitrary sector sizes where a tester processor directly controls the DUT according to an embodiment of the present invention.

Figure 1:
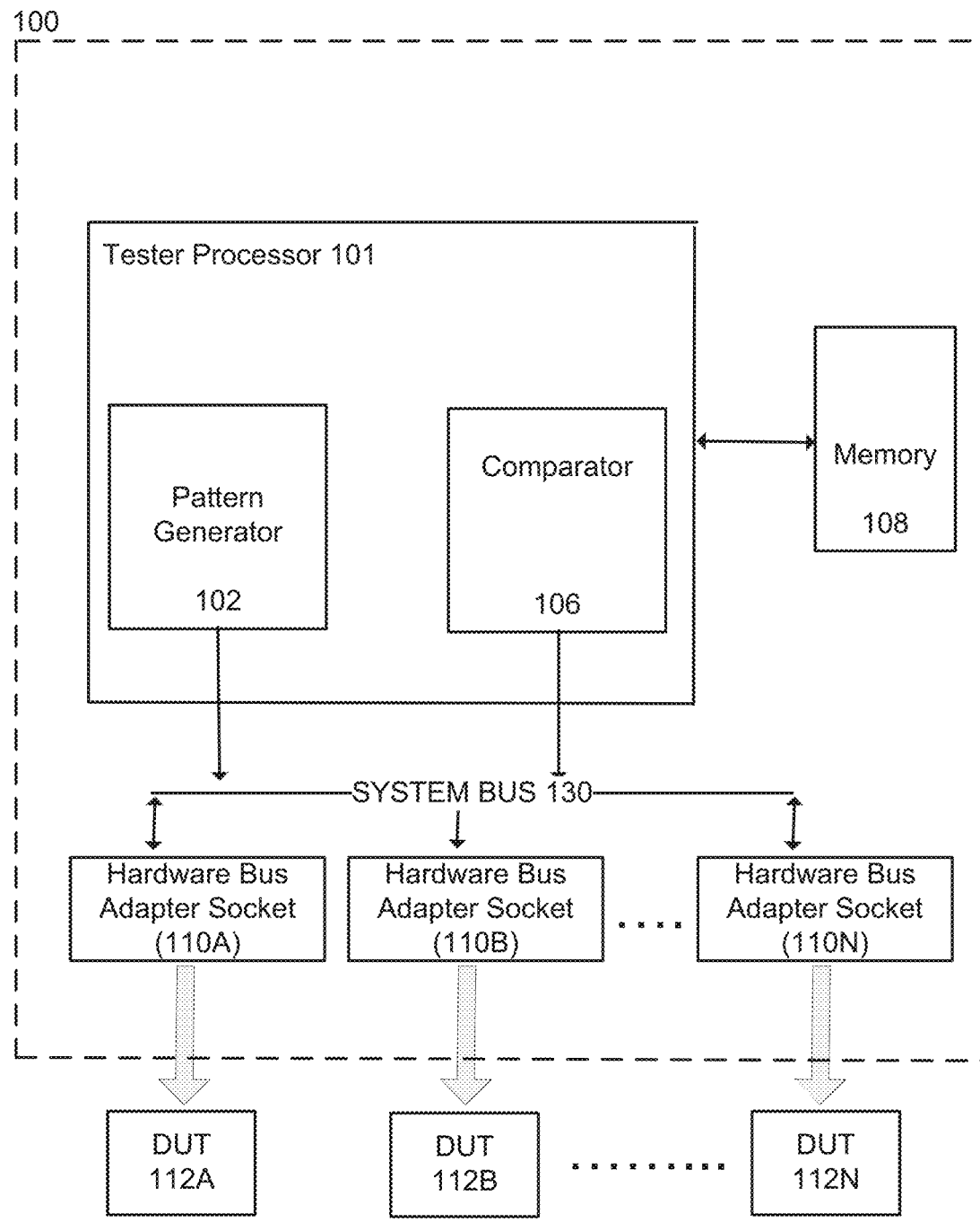
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accessing," "adding," "adjusting," "analyzing," "applying," "assembling," "assigning," "calculating," "capturing," "combining," "comparing," "collecting," "creating," "debugging," "defining," "depicting," "detecting," "determining," "displaying," "establishing," "executing," "generating," "grouping," "identifying," "initiating," "modifying," "monitoring," "moving," "outputting," "performing," "placing," "presenting," "processing," "programming," "querying," "removing," "repeating," "resuming," "sampling," "simulating," "sorting," "storing," "subtracting," "suspending," "tracking," "transforming," "unblocking," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

Software-Focused Solution for Arbitrary all-Data Odd Sector Size Support

Embodiments of the present invention allow test throughput to be improved by including operating system (OS) support within the tester for testing DUTs (e.g., solid state drives (SSDs), hard disk drives (HDDs), etc.) supporting different (e.g., odd, non-standard or arbitrary) sector sizes without reconfiguring the hardware. More specifically, the calculations and computing required to support arbitrary or non-standard sector sizes may be performed by a tester processor within the tester system. In other words, computation functionality for testing arbitrary all-data sector DUTs (e.g., SSDs) may, in one embodiment, by performed in software on a general-purpose tester processor. Embodiments of the present invention advantageously increase the number and types of devices under test (DUTs) that can be tested under prevailing hardware and time constraints, for example, by configuring the hardware so that DUTs supporting many different types of sector sizes can be tested with the same hardware without needing to replace or substitute any hardware components. Embodiments of the present invention are directed to improving test efficiency in the hardware of the automatic test equipment.

Figure 2:
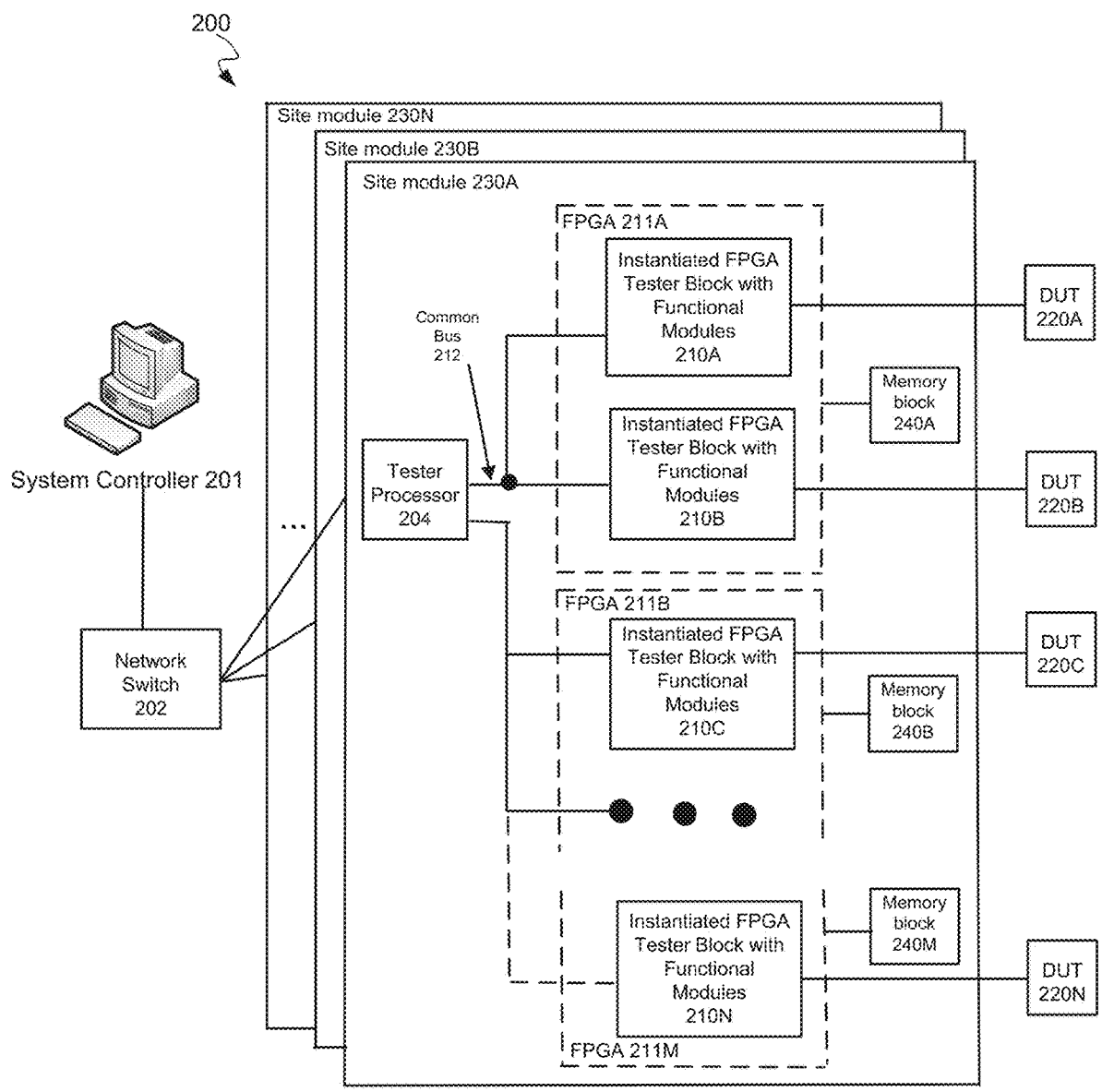
FIG. 2 is a high level schematic block diagram of the interconnections between the system controller, the site modules and the DUTs according to one embodiment of the present invention.
Figure 10:
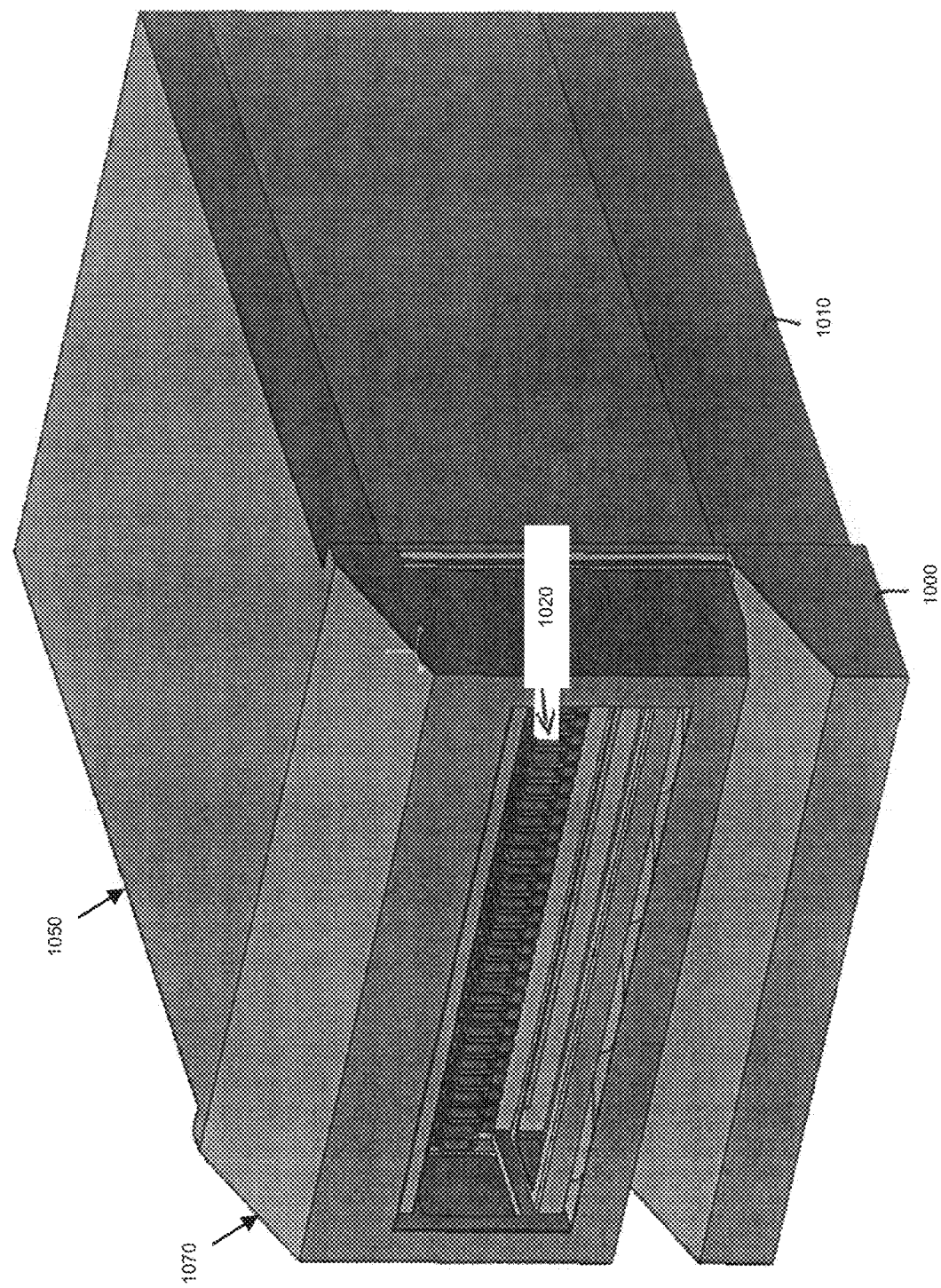
FIG. 10 illustrates a primitive interfaced with a Device Interface Board (DIB) in accordance with an embodiment of the invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously. For example, in one embodiment, apparatus 200 may be implemented inside a primitive as shown in FIG. 10.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N. It should be noted that the DUTs 220A-220N can, in one embodiment, be solid state drives (SSDs). Furthermore, it is possible for a single instantiated FPGA tester block, as shown in FIG. 2, to also be connected to multiple DUTs.

In one embodiment, the system controller 201 may be a computer system, e.g., a personal computer (PC) that provides a user interface for the user of the ATE to load the test programs and run tests for the DUTs connected to the ATE 200. In one embodiment, the system controller 201 may be running the Windows operation system (OS). The Verigy Stylus software executing in the Windows environment is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 201 can be connected to the site module boards 230A-230N through a network switch, such as an Ethernet switch. In other embodiments, the network switch may be compatible with a different protocol such as TCP/IP, Fibre Channel, 802.11 or ATM, for instance.

In one embodiment, each of the site module boards 230A-230N may be a separate standalone board used for purposes of evaluation and development that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly. Alternatively, the site module boards may be housed within an enclosure of a primitive (as shown in FIG. 10) and may connect to the various DUTs using a device interface board (DIB).

The site module boards 230A-230N can each comprise at least one tester processor 204 and at least one FPGA device. In one embodiment, the tester processor and its associated memory may be located on a separate board (not shown) affixed to the respective site module. This separate board may be called a Computer On Module (or COM) board. In other words, the FPGA may be located on a separate site module board while the tester processor (with an associated memory) is located on a COM board.

The tester processor 204 and the FPGA devices 211A-211M on the site module board run the test methods for each test case in accordance with the test program instructions received from the system controller 201. In one embodiment the tester processor can be a commercially available Intel x86 CPU or any other well-known processor. Further, the tester processor may be operating on the Ubuntu OS x64 operating system and running the Core Software, which allows it to communicate with the software running on the system controller, to run the test methods. In one embodiment, the tester processor 204 may be an x86 processor running the Linux OS or a modified version of the Linux OS. In one embodiment, the Linux OS running on the tester processor is able to receive commands and data from the Windows OS running on the system controller. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, for example in the standard or bypass mode, tester processor 204 can control the testing of the DUTs 220A-220N transparently through the FPGAs with minimal processing functionality allocated to the FPGA devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices, e.g., in protocol independent data accelerations (PIDA) or full acceleration (FA) modes as will be discussed further below. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240 M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A. In a different embodiment, each FPGA device can have multiple instantiated FPGA tester blocks, each with a respective memory block.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program. In a different embodiment, each instantiated FPGA tester block may also be connected to and configured to test multiple DUTs.

The architecture of the embodiment of the present invention depicted in FIG. 2 has several advantages. First, it eliminates the need for protocol-specific hardware bus adapter sockets and cards in the system because the communication protocol modules can be programmed directly on the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. In many cases, the IP core will comprise a third party protocol converter IP that converts signals from one protocol to another.

For example, the FPGAs 211A-211M in the ATE apparatus 200 will include an interface core that can be configured with the PCIe protocol to test PCIe devices initially and subsequently reconfigured via a software download to test SATA devices. The third party protocol converter IP programmed in the FPGA may be configured to convert incoming PCIe signals to SATA signals. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. As noted above, the IP cores may comprise third party protocol IP. This ensures compliance and compatibility according to a given interface standard. The programmable nature of the FPGA is utilized to optimize flexibility, cost, parallelism and upgradeability for storage testing applications from SSDs, HDDs and other protocol based storage devices.

For instance, instantiated FPGA tester block 210A can be configured to run the PCIe protocol while instantiated FPGA tester block 210B can be configured to run the SATA protocol (using, for example, third party protocol IP). This allows the tester hardware to test DUTs supporting different protocols simultaneously. FPGA 211A can now be connected to test a DUT that supports both PCIe and SATA protocols. Alternatively, it can be connected to test two different DUTs, one DUT supporting the PCIe protocol and the other DUT supporting the SATA protocol, where each instantiated functional module (e.g., 210A, 210B) is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations.

Figure 3:
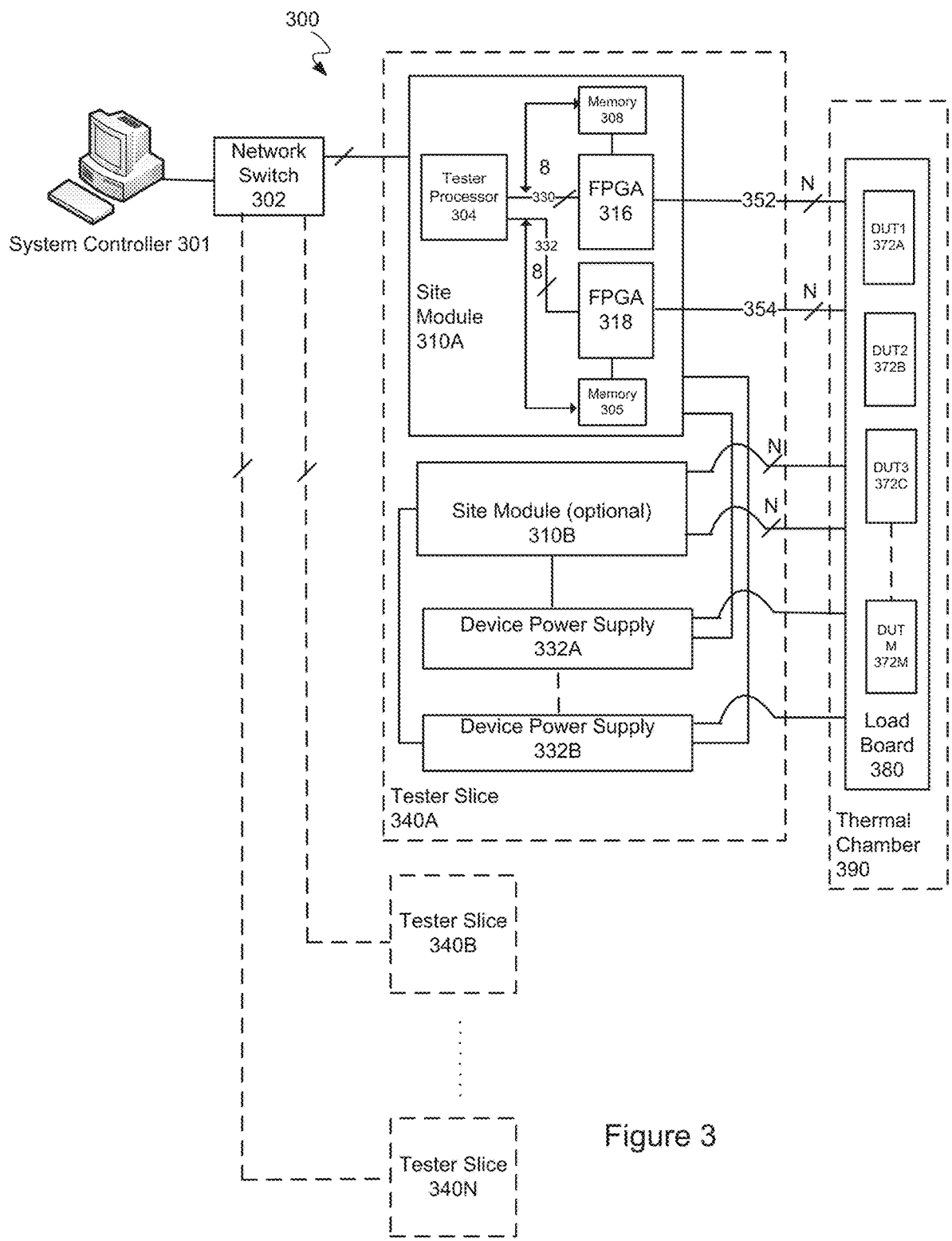
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs in accordance with an embodiment of the present invention.

Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

As mentioned above, in one embodiment, the system controller 301 may be a computer system, e.g., a personal computer (PC) that provides a user interface for the user of the ATE to load the test programs and run tests for the DUTs connected to the ATE 300. Typically the system controller will run the Windows operating system. The Advantest Stylus is one example of test software normally used during device testing. It provides the user with a graphical user interface from which to configure and control the tests. It can also comprise functionality to control the test flow, control the status of the test program, determine which test program is running, and log test results and other data related to test flow.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 305 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

In one embodiment, the communication protocol used to communicate between the tester processor 304 and the DUTs 372A-M can advantageously be reconfigurable. The communicative protocol engine in such an implementation is programmed directly into one or both of the FPGAs on the tester slice. The FPGA (e.g., 316 or 318) can therefore be configured to communicate with the DUTs in any protocol that the DUTs support. This advantageously eliminates the need for swapping out tester each time a DUT with a different protocol needs to be tested. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In one embodiment of the present invention, each FPGA comprises a number of protocol engine modules, wherein each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

Figure 4:
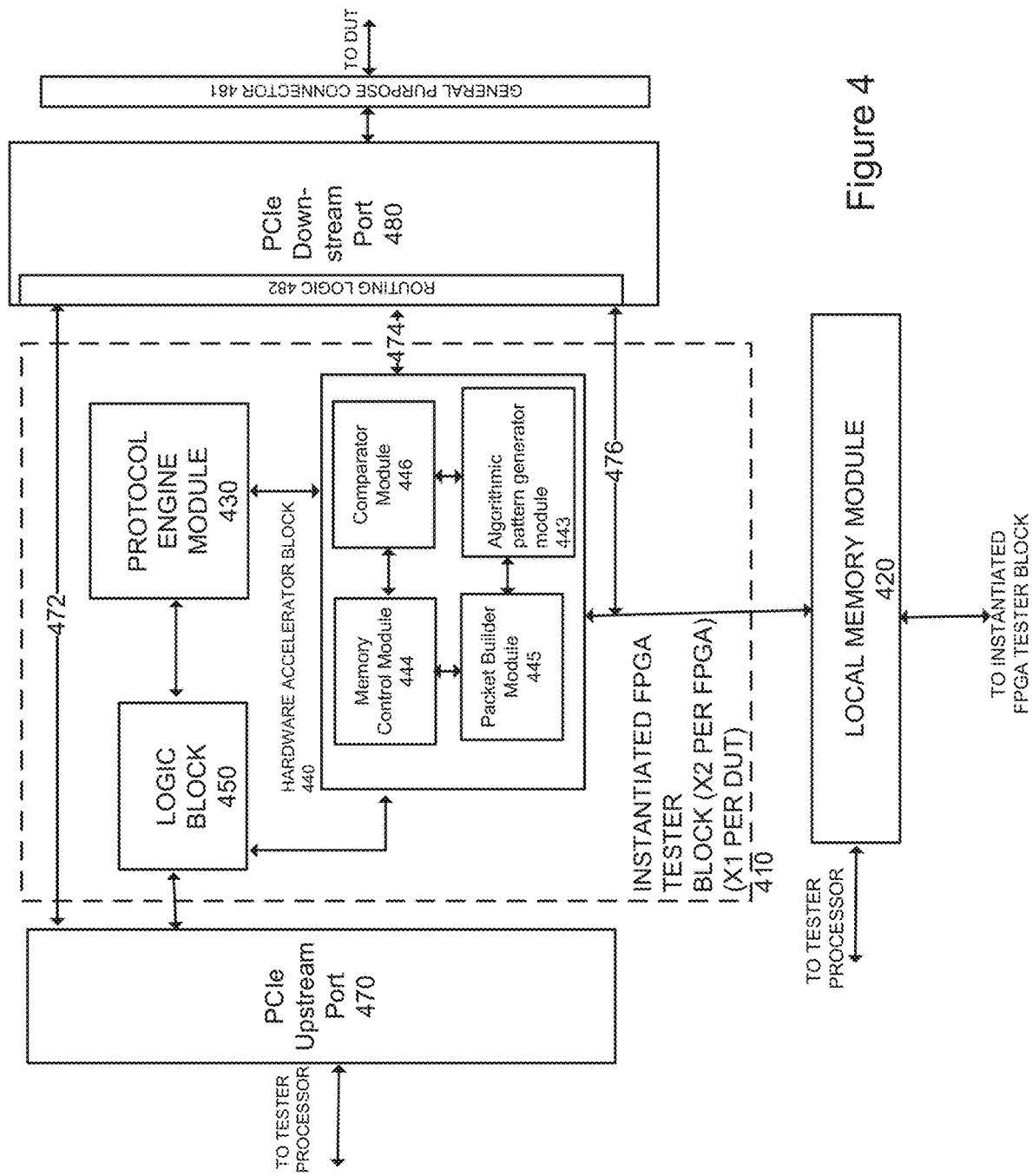
FIG. 4 is a detailed schematic block diagram of the instantiated FPGA tester block of FIG. 2 according to an embodiment of the present invention.

FIG. 4 is a detailed schematic block diagram of an instantiated FPGA tester block of FIG. 2 according to an embodiment of the present invention.

Referring to FIG. 4, the instantiated FPGA tester block 410 is connected to the tester processor through PCIe upstream port 270 and to the DUT through PCIe downstream port 480.

Instantiated FPGA block 410 can comprise a protocol engine module 430, a logic block module 450, and a hardware accelerator block 440. The hardware accelerator block 440 can further comprise a memory control module 444, comparator module 446, a packet builder module 445, and an algorithmic pattern generator (APG) module 443.

In one embodiment, logic block module 450 comprises decode logic to decode the commands from the tester processor, routing logic to route all the incoming commands and data from the tester processor 304 and the data generated by the FPGA devices to the appropriate modules, and arbitration logic to arbitrate between the various communication paths within instantiated FPGA tester block 410.

In one implementation, the communication protocol used to communicate between the tester processor and the DUTs can advantageously be reconfigurable. The communication protocol engine in such an implementation is programmed directly into the protocol engine module 430 of instantiated FPGA tester block 410. The instantiated FPGA tester block 410 can therefore be configured to communicate with the DUTs in any protocol that the DUTs support. The pre-verified interface or IP cores mentioned above, for example, can be programmed into the protocol engine module 430. This ensures compliance and compatibility according to a given interface standard. Further, the IP core allows the tester to achieve flexibility in that the IP core enables software-based changing of interfaces. Embodiments provide an ability to test multiple types of DUTs independent of the hardware bus adapter sockets. With such interface flexibility, new interfaces may be loaded into the IP core of a programmable chip thereby eliminating the need for the hardware bus adapter sockets (discussed in connection with FIG. 1).

In one embodiment, for example, for storage/SSDs/HDDs, each FPGA comprises a configurable IC that connects to a SSD and that is programmable to provide storage based patterns through a storage specific interface such as SATA or SAS.

In one embodiment, an FPGA may be an SSD module-based tester that uses protocol-based communications to interface with a DUT or module. In one embodiment, the configurable interface core may be programmed to provide any standardized protocol-based communications interface. For example, in one embodiment, in the case of an SSD module-base test, the interface core may be programmed to provide standardized protocol-based communications interfaces such as SATA, SAS, etc.

Accordingly, from an electrical perspective, the FPGAs utilize an IP core instead of a hardware bus adapter socket. Enabled by software programming of the programmable chip resources of an FPGA, a given IP core may be easily reprogrammed and replaced with another IP core without changing the physical FPGA chip or other hardware components. For example, if a given FPGA-based tester currently supports SATA, all that would be required to be able to connect to a SAS DUT is for the FPGA to be reprogrammed to use a SAS IP core instead of the existing IP core configured for SATA.

This advantageously eliminates the need for hardware bus adapter cards and no protocol-specific hardware need be replaced to test DUTs with different protocol support. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In FIG. 4, if the DUT coupled to the PCIe downstream port 480 is a PCIe device, a bit-file containing the instantiation of the PCIe protocol can be downloaded through the PCIe upstream port 470 and installed in the IP core on the protocol engine module 430. Each FPGA device 316 or 318 can comprise one or more instantiated FPGA tester block and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

The hardware accelerator block 440 of FIG. 4 can be used to expedite certain functions on FPGA hardware than would be possible to do in software on the tester processor. The hardware accelerator block 440 can supply the initial test pattern data used in testing the DUTs. It can also contain functionality to generate certain commands used to control the testing of the DUTs. To generate test pattern data, accelerator block 440 uses the algorithmic pattern generator module 443.

The hardware accelerator block 440 can use comparator module 446 to compare the data being read from the DUTs to the data that was written to the DUTs in a prior cycle. The comparator module 446 comprises functionality to flag a mismatch to the tester processor 304 to identify devices that are not in compliance. More specifically, the comparator module 446 can comprise an error counter that keeps track of the mismatches and communicates them to the tester processor 304.

Hardware accelerator block 440 can connect to a local memory module 420. Memory module 420 performs a similar function to a memory module within any of the memory blocks 240A-240M. Memory module 420 can be controlled by both the hardware accelerator block 440 and the tester processor 304. The tester processor 304 can control the local memory module 420 and write the initial test pattern data to it.

The memory module 420 stores the test pattern data to be written to the DUTs and the hardware accelerator block 440 accesses it to compare the data stored to the data read from the DUTs after the write cycle. The local memory module 420 can also be used to log failures. The memory module would store a log file with a record of all the failures the DUTs experienced during testing. In one embodiment, the accelerator block 440 has a dedicated local memory module block 420 that is not accessible by any other instantiated FPGA tester blocks. In another embodiment, the local memory module block 420 is shared with a hardware accelerator block in another instantiated FPGA tester block.

Hardware accelerator block 440 can also comprise a memory control module 444. The memory control module 444 interacts with and controls read and write access to the memory module 420.

Finally, hardware accelerator block 440 comprises a packet builder module 445. The packet builder module is used by the hardware accelerator block in certain modes to construct packets to be written out to the DUTs comprising header/command data and test pattern data.

In one embodiment, the site module can comprise a general purpose connector 481. Because the protocol engine module 430 can be configured to run any number of various communicative protocols, a general purpose high speed connector 481 is required on the site module. Accordingly, if the protocol implemented on the protocol engine module 430 needs to be changed, no accompanying physical modification needs to be made on the site module. The site module connects to the DUT using load board 380 that can connect to the general purpose connector on the site module end, but is specific to the protocol being implemented on the DUT end. DUTs supporting different communicative protocols will require different configurations. Accordingly, the load board needs to be switched out and replaced if the protocol is reprogrammed to accommodate DUTs requiring a different configuration.

FIG. 10 illustrates a primitive 1010 interfaced with a Device Interface Board (DIB) 1000 in accordance with an embodiment of the invention. Similar to the tester slice (e.g., 340A, etc.) shown in FIG. 3, the primitive of FIG. 10 is a type of discrete test module that fits into a test head and comprises the test circuitry, which performs tests on the DUTs in accordance with a test plan. A primitive comprises an enclosure 1050 within which all the various electronics, e.g., site modules, power supplies, etc. are housed. The DIB 1000 can connect with a plurality of DUTs 1020 using custom connectors sized for the DUTs 1020. The DUTs physically interface and electronically interface to the DIB 1000. The primitive can also comprise an enclosure 1070. The DIB 1000 interfaces to a universal backplane (not shown) of the primitive 1010 through a load board (not shown) similar to load board 380 shown in FIG. 3. The primitive 1010 contains test circuitry (similar to tester slice 340A shown in FIG. 3) for performing a test plan on the DUTs 1020. The primitive 1010 can operate independently of any other primitive and is connected to a control server (similar to system controller 301 shown in FIG. 3).

It should be noted that DUTs connected to any given tester slice (e.g., 340A-340N) or any given primitive are capable of running a different protocol than one or more other DUTs connected to the same respective tester slice or primitive. For example, the primitive 1010 may be connected to and used to test a plurality of DUTs 1020, each of which can run a different protocol, e.g., SATA, ATA, SCSI, etc. In one embodiment, primitive 1010 may be connected to and used to test primarily SSD drives.

Figure 11:
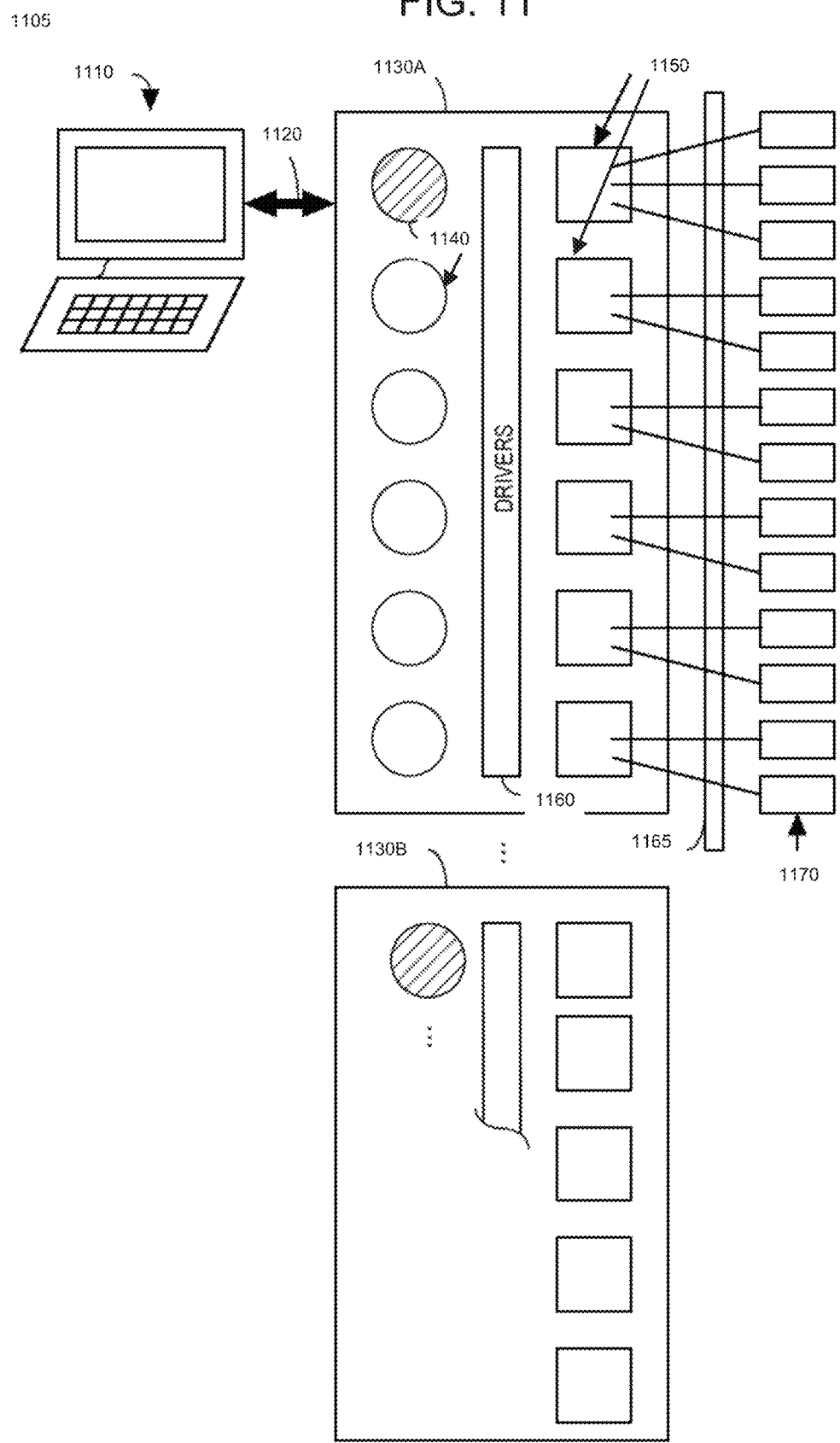
FIG. 11 is an exemplary high level block diagram of the automatic test equipment apparatus in which a host controller is connected to and controls test operations for a plurality of primitives in accordance with an embodiment of the present invention.

FIG. 11 is an exemplary high level block diagram of the automatic test equipment (ATE) apparatus in which a host controller is connected to and controls test operations for a plurality of primitives in accordance with an embodiment of the present invention. FIG. 11 illustrates the overall integrated system or testing framework 1105 for testing SSDs supporting various odd sector sizes (or non-standard sector sizes) and protection modes.

In one embodiment, a Windows based host controller 1110 may be communicatively coupled to several different primitives, e.g., 1130A and 1130B. The Windows based host controller 1110 is capable of displaying graphical user interfaces to users for displaying information and for accepting user input. A communication backplane 1120 is coupled between the host controller 1110 and one or more primitives 1130A and 1130B. Each primitive comprises a number of tester slices (e.g., tester slices 340A-340N). In one embodiment, each primitive may comprise a number of COM boards 1140 (comprising a tester processor and associated memory) that are coupled to a number of FPGA tester slices 1150 via drivers 1160. (As mentioned previously, in one embodiment, the tester processor may be located on a COM board that is a separate board from the tester slices comprising the FPGAs). The tester slices, in one embodiment, are coupled to DUTs (e.g. SSDs) via a device interface board 1165. A different DIB can be used to support SSDs of different form factors and connection types. There can be several primitives within a rack, where each primitive is coupled to and controlled by the host controller. This allows a large volume of DUTs to be tested concurrently.

In one embodiment, the COM boards 1140 may contain an instance of the embedded OS platform in accordance with the present invention. The COM boards 1140 may control the tester slices 1150 within the primitives. The embedded OS platform is configured to communicate on one side with the host controller 1110 and on the other side the various FPGA tester slices 1150 that are populated within a primitive. In one embodiment, the embedded OS platform can be a heavily modified version of the Linux OS. There can be as many as 32 instances of embedded OS platforms within the system 1105 and controlled by the host controller 1110. The various OS platforms provide functionality to communicate with the FPGA tester boards 1150 and also to communicate directly with the DUTS 1170.

In certain embodiments, hardware accelerator block 440 can be programmed by the tester processor 304 to operate in one of several modes of hardware acceleration.

I. Multiple Modes of Hardware Acceleration

In bypass or standard mode, the hardware accelerator is bypassed and commands and test data are sent by the tester processor 304 directly to the DUT through path 472. Note that the testing of all-data sector DUTs of non-standard or arbitrary sizes is, in one embodiment, enabled using the bypass or standard mode. In other words, in one embodiment, the bypass mode comprises a feature whereby the tester processor performs the computations to test DUTs with arbitrary sector sizes.

It should further be noted that, in one embodiment, the tester processor 304 may communicate directly with the DUTs to test all-data sector DUTs of non-standard or arbitrary sizes. In other words, in this embodiment, the FPGA (with its programmable core and various configurable modes of operation) is not necessary because the tester processor 304 may communicate directly with the DUTs.

In hardware accelerator pattern generator mode, test pattern data is generated by the APG module 443 of the FPGA while the commands are generated by the tester processor 304. The test packets are transmitted to the DUT through path 474. This mode is also known as Protocol Independent Data Acceleration (PIDA) mode.

In hardware accelerator memory mode, the test pattern data is accessed from local memory module 420 associated with the FPGA while the commands are generated by the tester processor 304. The test pattern data is transmitted to the DUT through path 476. Routing logic 482 is needed to arbitrate between paths 472, 474 and 476 to control the flow of data to the DUT.

In hardware accelerator packet builder mode, the test pattern data may be generated by the APG module 443 of the FPGA and the packet builder module 445 of the FPGA is used to construct packets to be written out to the DUTs comprising header/command data and test pattern data. The test packets are transmitted to the DUT through path 474. This mode is also known as Full Acceleration (FA) mode.

Figure 5:
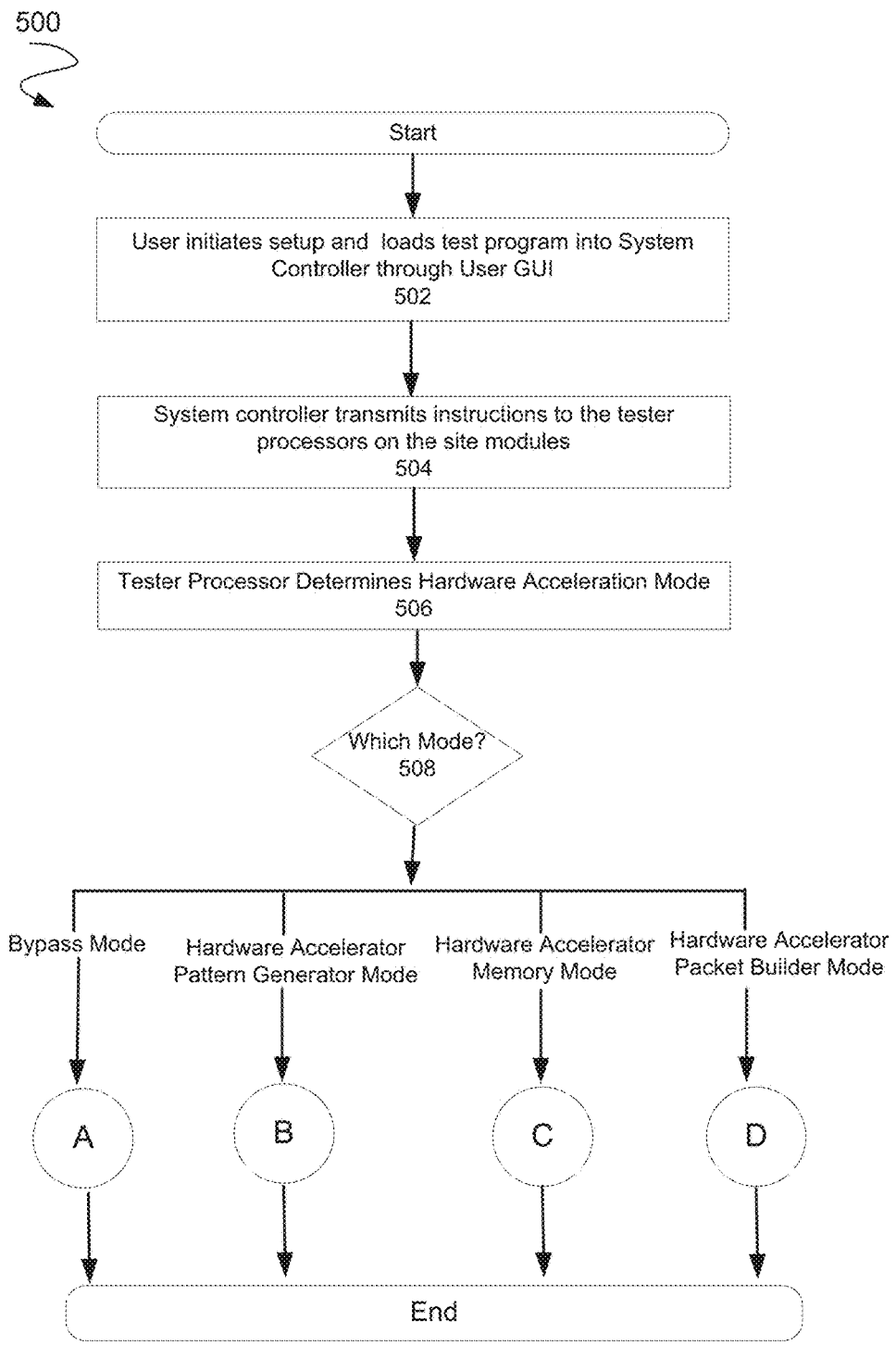
FIG. 5 is a high level flowchart of an exemplary method of testing DUTs according to an embodiment of the present invention.

FIG. 5 depicts a flowchart 500 of an exemplary process of testing DUTs according to an embodiment of the present invention. The invention, however, is not limited to the description provided by flowchart 500. Rather, it will be apparent to persons skilled in the relevant art(s) from the teachings provided herein that other functional flows are within the scope and spirit of the present invention.

Flowchart 500 will be described with continued reference to exemplary embodiments described above in reference to FIGS. 2, 3 and 4, though the method is not limited to those embodiments.

Referring now to FIG. 5, the user initiates setup and loads the test program into system controller at block 502. Initiating setup can comprise choosing one or more protocols from a library of available protocols to be configured onto the FPGA devices in the ATE apparatus 200. The protocols are cached as files on the system controller 301 and can be downloaded as bit files onto the FPGAs. The user can select the protocol from a list of releases available through a graphical user interface. Before a protocol is made available as an option, it has to be built, tested and integrated into a release. FPGA configurations that are released, among other things, contain definitions regarding the protocols supported and the number of transceivers available to connect DUTs. The library of releases can then be made available to a user through a graphical user interface on the system or host controller.

At block 502, the user also loads the test program into the system controller 301 through the graphical user interface. The test program defines all the parameters of the test that needs to be run on the DUTs. At block 504, the system controller transmits instructions to the tester processor on the site module 310A. This step includes the transmission of the bit files for the protocol engines to be programmed onto the FPGAs. The system controller can comprise routing logic to route instructions for a particular test program to the tester processor connected to the DUT controlled by the test program.

At block 506, after receiving instructions from the system controller, the tester processor 304 can determine the hardware acceleration mode for running the tests on the DUTs connected to site module 310A.

In one embodiment, the tester processor 304 can operate in one of four different hardware acceleration modes. Each functional mode is configured to allocate functionality for generating commands and test data between the tester processor 304 and the FPGAs 316 and 318. In one embodiment, the tester processor can be programmed to operate in bypass or standard mode, wherein all the commands and test data for testing the DUTs is generated by the tester processor 304 and the FPGAs 316 and 318 are bypassed.

In another embodiment, the tester processor 304 can be programmed to operate in hardware accelerator pattern generator mode (or PIDA mode), wherein pseudo-random or random data to be used in the testing of the DUTs is generated by the FPGAs 316 and 318 and the comparing is also done by the FPGAs, but the tester processor handles the command generation.

In yet another embodiment, the tester processor 304 can be programmed to operate in hardware accelerator memory mode, wherein the test pattern is pre-written onto the memory module connected to each FPGA 316 and 318 by the tester processor during initial set-up. The FPGAs in this mode access the dedicated memory device to retrieve the test data to be written to the DUTs, read the test data from the DUTs and compare the read data with the data written on the memory device. In this mode, each of the FPGAs control the memory device in response to read and write operations from the DUTs. The tester processor, however, is still responsible for the command generation in this mode.

In still another embodiment, the tester processor 304 can be programmed to operate in hardware accelerator packet builder mode (or Full Acceleration mode), wherein the data and basic read/writ/compare commands are generated by the FPGAs 316 and 318.

At block 508, the tester processor branches out to the mode under which the test will be run.

It should be noted that the FPGA 1035 of FIG. 10 can be programmed with any of the four functional modes discussed above, namely, the bypass mode, the hardware accelerator pattern generator mode, the hardware accelerator memory mode and the hardware accelerator packet builder mode. In one embodiment, the computer or system controller that the tester card 1000 is connected to via connector 1010 will perform the functions of the tester processor 304.

I. A) Bypass (or Standard) Mode

Figure 6:
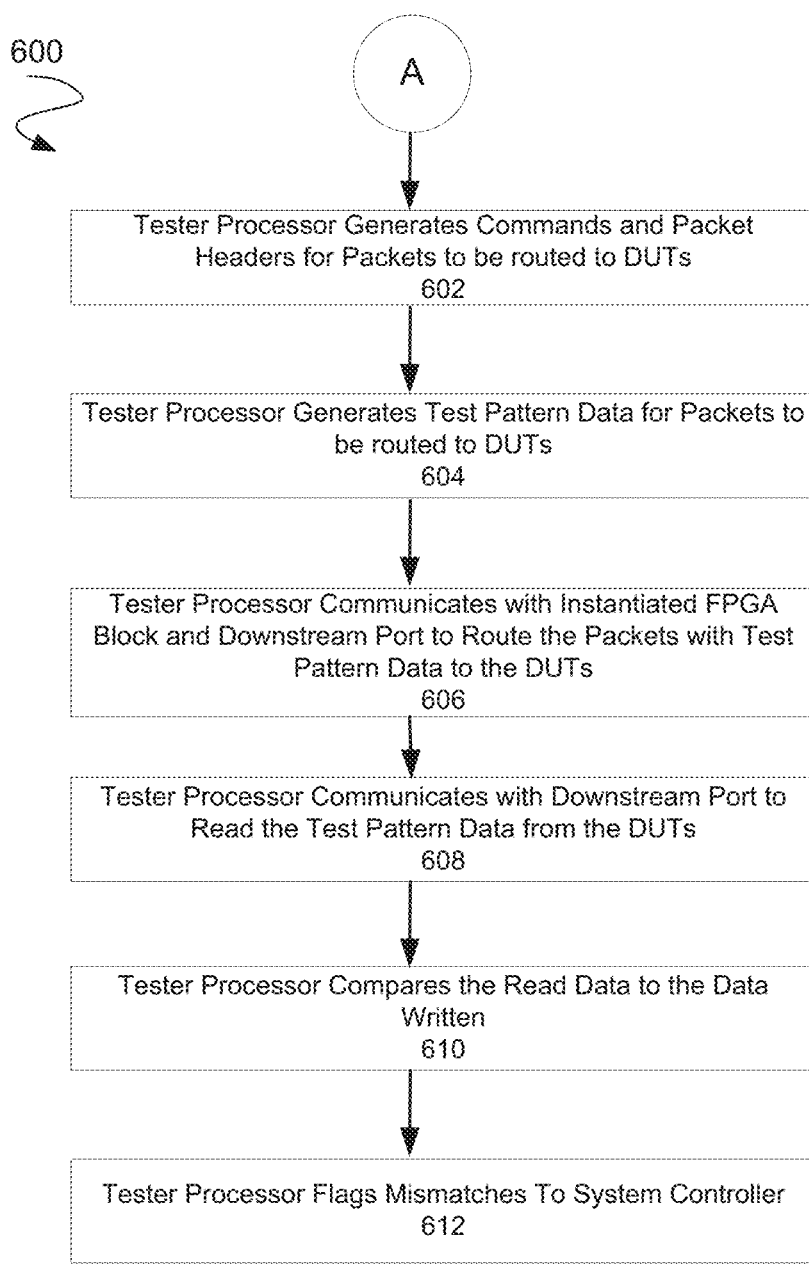
FIG. 6 is a continuation of FIG. 5 and is a flowchart of an exemplary method of testing DUTs in the bypass mode in one embodiment of the present invention.

FIG. 6 depicts a flowchart 600 of an exemplary process of testing DUTs in the bypass mode according to an embodiment of the present invention. The invention, however, is not limited to the description provided by flowchart 600. Rather, it will be apparent to persons skilled in the relevant art(s) from the teachings provided herein that other functional flows are within the scope and spirit of the present invention.

Flowchart 600 will be described with continued reference to exemplary embodiments described above in reference to FIGS. 2, 3 and 4, though the method is not limited to those embodiments.

Referring now to FIG. 6, in bypass mode, at block 602 the tester processor 304 generates commands and packet headers for the test packets to be routed to the DUTs. The tester process at block 604 also generates the test pattern data for the packets to be routed to the DUTs. In this mode there is no hardware acceleration because the tester processor generates its own commands and test data.

At block 606, the tester processor communicates with instantiated FPGA block 410 and downstream port 480 to route the test packets containing the test pattern data to the DUTs. The bypass mode is a pass through mode, wherein, with some limited exceptions, the commands and data pass transparently through the instantiated FPGA block 410 directly to the DUTs. The DUTs are directly controlled by the tester processor 304 in bypass mode. While the instantiated FPGA block can comprise logic to route the packets through to the downstream port, it is not involved in either the command generation (also referred to as "signaling") or the data generation.

At block 608, the tester processor 304 communicates with downstream port 480 to initiate a read operation from the DUTs of the data that was previously written to the DUTs at block 606. At block 610, the tester processor compares the data read from the DUTs to the data written at block 606. If there is any mismatch between the data written at block 606 and the data read at block 610, a flag is sent by the tester processor 304 to the system controller 301 at block 612. The system controller will then flag the mismatch to the user.

It should be noted that the bypass or standard mode is the principal operational mode for testing all-data odd sector size DUTs. In other words, the all-data odd sector sized DUTs can be tested using just the bypass or standard mode and connecting the tester processor directly to the DUTs or through the FPGA (where the FPGA is used as a pass-through device). The other modes of operation (e.g., PIDA or Full Acceleration) are not critical to testing all-data odd sector size DUTs.

Arbitrary all-Data Odd Sector Size Support in Standard Mode

In one embodiment, the standard (or bypass) mode is utilized when testing DUTs with all-data arbitrary sized sectors, e.g., SSD DUTs. Note that while bypass mode is utilized to test arbitrary-sized sector DUTs, the tester processor 304 may be constrained in speed because its processing capabilities may be maximized quickly from generating all the commands and test data for the DUTs.

Embodiments of the present invention configure the software (e.g. software executing on tester processor 304 of FIG. 3) to provide a system that can handle testing of all-data sector SSDs of any sector size, including non-standard sizes. By comparison, conventional tester system do not provide arbitrary sector size testing. For instance, Linux-based systems provide support for only 512-byte or 4096-byte sized sectors. Most other systems use hardware to hide non-standard data sector sizes and have limitations on the sizes are supported.

FIG. 12A illustrates the application layers comprising the software stack executing on the tester processor in accordance with an embodiment of the present invention. The software stack executing on tester software can comprise at least four layers. The layers comprise a device driver layer 1240, a Linux block layer 1230, a Vast System software (VSS) layer 1220 and the user application layer 1210. Note that the device driver layer 1240 is configured to communicate with the DUT 1250.

In one embodiment, the device driver layer 1240 is configured to communicate with the DUT 1250 and query the DUT to determine the sector size. Once the DUT Real Sector Size (RSS) is reported to the device driver layer 1240, the device driver layer 1240 communicates the information up to the user application layer 1210 through the VSS layer.

For example, consider a read operation on an SDD comprising a non-standard sector size of 524 bytes. When the data request is transmitted down the protocol stack from the user application layer 1210, the VSS layer 1220 calculates and rounds down the sector size (e.g., 524 bytes for this example) to the nearest number that the Linux block layer 1230 supports (e.g., 512 bytes). For example, the Linux block layer 1230 may only contain support for DUTs with a 512 byte sector size. Further, the VSS layer 1220 maintain a record of an extra 12 bytes of information (524 bytes-512 bytes).

In this example, if the user application layer 1210 requests N blocks (or N sectors) of data (e.g., 524*N bytes), the VSS layer 1220 will make a request to the Linux block layer 1230 for (N+M) blocks, where the N blocks will comprise data for 512 bytes and where the M blocks will comprise the additional data for the remaining 12 bytes per block (in the case of a 524 byte sized sector). The value of M is computed by the software where the M blocks are able to hold the additional data from all the N blocks. For example, in the case N=100, the total additional number of bytes would be 12*100=1200 bytes. To contain 1200 bytes, at least 3 blocks of size 512 bytes would need to be requested from the Linux block layer 1230. Accordingly, if M=3 is used, the 3 additional blocks hold the additional bytes from the N blocks where N=100. Accordingly, the VSS layer 1220 can make a request of 100+3 blocks to the Linux block layer 1230. The Linux block layer 1230 translates the request into a request for 103 blocks of 512 bytes (103*512 bytes) and this operation is permitted by the Linux block layer 1230.

Thereafter, the request is passed down to the device drive layer 1240. The device driver layer 1240 is in communication with the DUT 1250 directly and is able to determine that the DUT has a non-standard sector size of 524 bytes. Further, the device driver layer 1240 can determine that the Linux block layer 1230 is presenting a request for 103 blocks of size 512 bytes each.

The device driver layer is able to use the information regarding the sector size for the DUT and the number of blocks requested by the Linux block layer 1230 to determine that the request originally made at the user application layer 1210 was for 100 blocks. Accordingly, the device driver layer 1240 transmits a request to the DUT for 100 blocks, which the DUT responds to by filling up the buffer in the device driver layer 1240 with 100*524 bytes. The information in this buffer is passed through the Linux block layer 1230. Thereafter, the user application layer 1210 obtains 100 blocks of 524 bytes in each sector. In one embodiment, the write operation is conducted similarly to the example of the read operation above.

Note that the user application layer 1210, the VSS layer 1220 and the device driver layer 1240 comprise additional logic (modules 1293, 1292 and 1291 respectively) to be able to recognize DUTs of arbitrary sector sizes. The Linux block layer 1230 does not comprise additional logic to determine if a DUT comprises arbitrary sector sizes or to be able to communicate with it.

FIG. 12B illustrates the function of each of the application layers comprising the software stack executing on the tester processor in accordance with an embodiment of the present invention. As shown in FIG. 12B, the user application layer 1210 receives information regarding the DUT sector size. In the example discussed above, for a read of 100 sectors of information from the DUT, the user application layer 1210 would request data from 100 sectors (or blocks). Given the limitation of the Linux block layer 1230, discussed above, the VSS layer 1220 makes a request for 103 blocks (N+M=100+3) from the Linux block layer 1230. The Linux block layer 1230 does not support non-standard sector sizes, but given the standard sector size of 512 bytes, the Linux block layer 1230 is configured to check that the requested length of information meets its limitations of processing data in multiples of 512 bytes. Accordingly, it allows requests to pass down the protocol stack and data from the DUT to be passed up the protocol stacks.

The device driver layer 1240 communicates with the DUT and, therefore, is able to use the information regarding the sector size for the DUT to calculate how many sectors worth of information to request from the DUT. In the example discussed above, the device driver layer 1240 would request 100 blocks of information. The DUT 1250 in turn would receive the request from the device driver layer 1240 and fulfill the request.

Embodiments of the present invention control inputs, outputs, drivers and user space to advantageously provide a software-only solution for testing SSDs of any arbitrary sector size without sacrificing performance because no data copy is required. Embodiments of the present invention advantageously expand the scope of devices that can be tested and gives users of the tester system direct access to the data of the full sector.

In one embodiment, the tester processor (in standard or bypass mode, or a variant thereof) is used to read and write data to the DUTs. The FPGA may not be able to support DUTs with arbitrary-sized sectors because it only supports a limited amount of predefined data sizes. Once configured (after the bitstream download onto an FPGA), at run time, an FPGA may only support a limited short list of sector sizes. It is appreciated that programming the tester software on the tester processor to test DUTs of arbitrary sector sizes allows a user to read and write any length of user-specified data from and to the DUTs and is, therefore, advantageously versatile. At run time, the tester processor is able to support any arbitrary sector size and is not limited to any particular predefined size.

Embodiments of the present invention provide a "software only solution" which allows user to test devices of arbitrary sector size with user data pattern. In the case of a write to a device under (DUT), the software running on the tester processor generates the complete data and commands to perform the testing on the sector. In the case of reading, the software reads back the complete data from the sector, without stripping additional bytes.

Embodiments of the present invention are flexible and able to test devices of any sector size that use the whole sector for data storage. It provides user access to the whole sector without stripping or inserting any additional bytes. It does this without sacrificing performance because no additional data copy is required.

Conventional ATE comparatively is limited because it does not support testing of drives with all-data odd sector size drives. Embodiments of the present invention advantageously allow software-based testing of such drives and, in particular, testing of arbitrary non-standard sector sizes.

FIG. 13 depicts a flowchart of an exemplary computer-implemented process of testing DUTs supporting arbitrary sector sizes according to an embodiment of the present invention. The invention, however, is not limited to the description provided by flowchart 1300. Rather, it will be apparent to persons skilled in the relevant art(s) from the teachings provided herein that other functional flows are within the scope and spirit of the present invention.

At block 1310, a host controller is coupled to a tester processor and an FPGA. The host controller may be a Windows based operation system as discussed above. Further, the tester processor may be running the Linux or a modified version of the Linux OS. The FPGA is communicatively coupled to the tester processor and is operable to generate commands and data for testing a DUT in accordance with one of the various acceleration modes discussed above.

At block 1312, an acceleration mode is selected for generating commands and data for testing the DUT. The acceleration mode may be a standard or bypass mode where the tester processor generates all the commands and data and the FPGA is bypassed. Note that, as stated above, standard or bypass mode may, in one embodiment, be the primary or principal mode required to test all-data non-standard sized DUTs.

At block 1314, a command (e.g., a read, write, etc.) is generated by the tester processor to the DUT, where the DUT comprises an arbitrary sector size.

In response to the read command then, at block 1316, the VSS layer of the tester software executing on the tester processor calculates and rounds down the sector size (e.g., 524 bytes for the example above) to the nearest number that the Linux block layer 1230 supports (e.g., 512 bytes). Further, if the user application layer 1210 requests N blocks (or N sectors) of data, the VSS layer 1220 will make a request to the Linux block layer 1230 for (N+M) blocks, where each of the N blocks is a standard sized block (e.g., 512 bytes) and where the M blocks will comprise the data for the additional bytes per block.

At block 1318, the Linux block layer 1230 is programmed to check that the requested length of information meets its limitations of processing data in multiples of standard sized blocks (e.g., multiples of 512 bytes in the case of the example above). Thereafter, it allows requests to pass down the protocol stack and data from the DUT to be passed up the protocol stacks At block 1320, the device driver layer 1240 communicates with the DUT and is able to use the information regarding the sector size for the DUT to calculate the number of sectors in the DUT that need to be accessed (e.g., either for a read or write operation).

At block 1322, data from the determined number of sectors from the DUT is accessed and a compare operation is performed to test the DUT. For example, data can be read from or written to the DUT and compared against expected data to determine if the DUT is functioning properly.

FIG. 14 depicts a flowchart of an exemplary computer implemented process of testing DUTs supporting arbitrary sector sizes where a tester processor directly controls the DUT according to an embodiment of the present invention.

At block 1410, a host controller is coupled to a tester processor. The host controller may be a Windows based operation system as discussed above. Further, the tester processor may be running the Linux or a modified version of the Linux OS. The tester processor is configured to be in direct communication with a DUT and issue commands and data directly to the DUT. As noted above, while in one embodiment, the tester processor can operate in bypass mode and test the DUTs using the FPGA as a pass-through device, in other embodiments, the tester processor may be directly connected to the DUTs.

At block 1412, a command (e.g., a read, write, etc.) is generated by the tester processor directed at the DUT, where the DUT comprises an arbitrary sector size.

In response to the read command then, at block 1414, the VSS layer calculates and rounds down the sector size (e.g., 524 bytes for this example) to the nearest number that the Linux block layer 1230 supports (e.g., 512 bytes). Further, if the user application layer 1210 requests N blocks (or N sectors) of data, the VSS layer 1220 will make a request to the Linux block layer 1230 for (N+M) blocks, where each of the N blocks is a standard sized block (e.g., 512 bytes) and where the M blocks will comprise the data for the additional bytes per block.

At block 1416, the Linux block layer 1230 is programmed to check that the requested length of information meets its limitations of processing data in multiples of standard sized blocks e.g., multiples of 512 bytes in the case of the example above. Accordingly, it allows requests to pass down the protocol stack and data from the DUT to be passed up the protocol stacks At block 1418, the device driver layer 1240 communicates with the DUT and is able to use the information regarding the sector size for the DUT to calculate how many sectors worth of information to request from the DUT.

At block 1420, data from the determined number of sectors from the DUT is accessed and a compare operation is performed to test the DUT. For example, data can be read from or written to the DUT and compared against expected data to determine if the DUT is functioning properly.

I. B) Hardware Accelerator Pattern Generator Mode (PIDA Mode)

Figure 7:
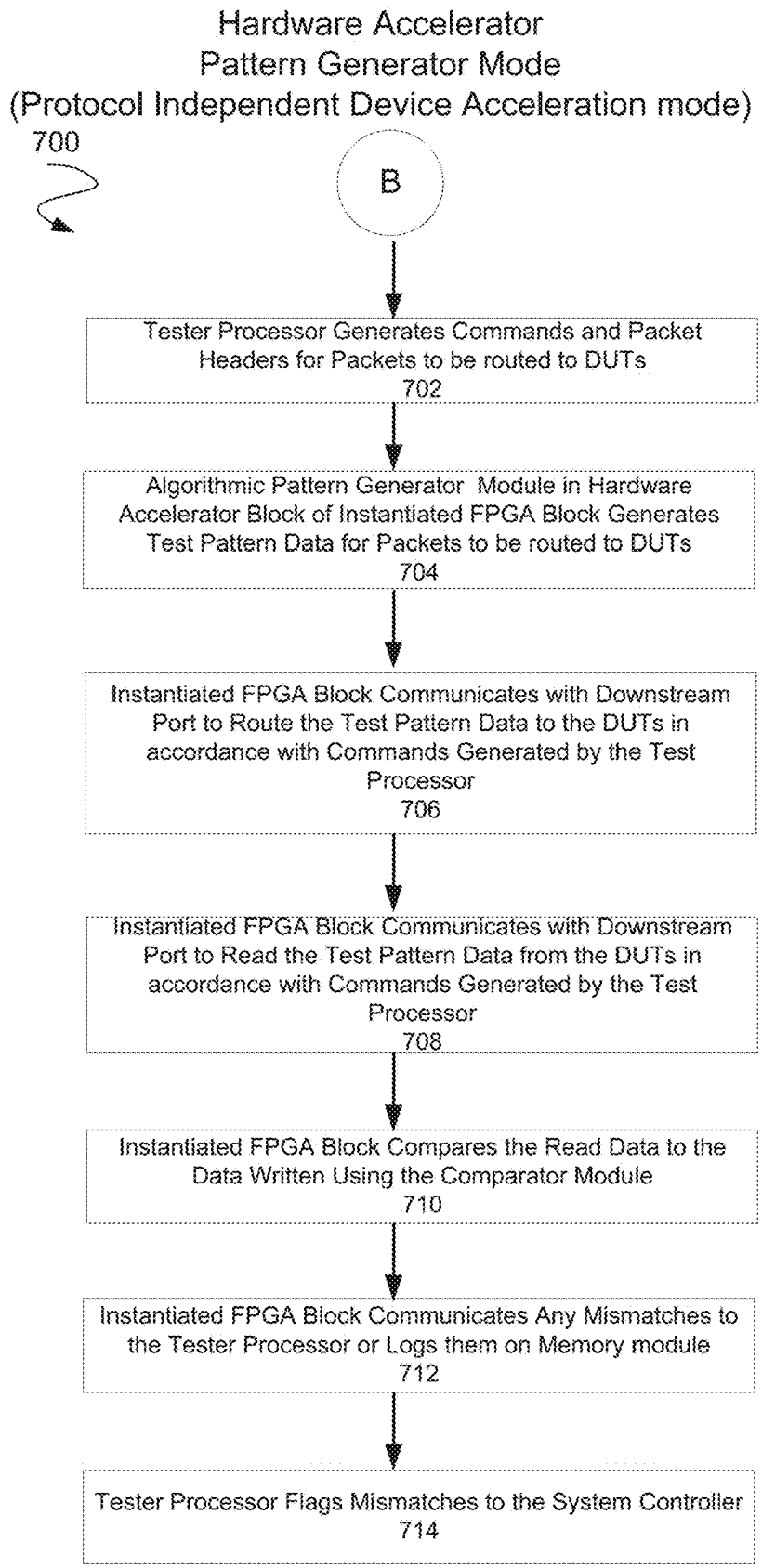
FIG. 7 is a continuation of FIG. 5 and is a flow chart of an exemplary method of testing DUTs in the hardware accelerator pattern generator mode in one embodiment of the present invention.

FIG. 7 depicts a flowchart 700 of an exemplary process of testing DUTs in the hardware accelerator pattern generator mode according to an embodiment of the present invention. The invention, however, is not limited to the description provided by flowchart 700. Rather, it will be apparent to persons skilled in the relevant art(s) from the teachings provided herein that other functional flows are within the scope and spirit of the present invention.

Flowchart 700 will be described with continued reference to exemplary embodiments described above in reference to FIGS. 2, 3 and 4, though the method is not limited to those embodiments.

Referring now to FIG. 7, a method of hardware acceleration is shown wherein the FPGA devices share data generation functionality so as to relieve the processing load on the tester processor 304 and the data load on system buses 330 and 332. At block 702 of the hardware accelerator pattern generator mode, the tester processor 304 generates commands and packet headers for the packets to be routed to the DUTs. The tester process retains the functionality for signaling in this mode. The algorithmic pattern generator module 443 within the hardware accelerator block 440 generates the pseudo random test data to be written to the DUTs at block 704. The logic block module 450 comprises functionality for routing the data generated and adding it to the packets to be written out to the DUTs.

The mode is considered "hardware accelerated" because the functionality for generating data can be done much faster in hardware by the algorithmic pattern generator of the FPGA device than in software by the tester processor. Also the "tester per DUT" architecture allows the DUT to be directly connected to its own dedicated instantiated FPGA tester block generating test pattern data for the DUT as shown in FIG. 4, which results in a substantial increase in bandwidth over the bypass mode where the tester processor 304 supplies all commands and data to the DUTs over system buses 330 and 332. With the FPGA devices sharing in the data generation functionality, the system buses 330 and 332 are freed up so commands can be communicated to the FPGAs at a faster rate than in the bypass mode. Further, for devices, such as solid state drives that require several iterations of testing, having a dedicated data path through the instantiated FPGA tester block speeds up testing considerably over one where the resources of the tester processor are shared by several DUTs. It also allows the DUT to operate at close to full performance because it does not have to wait for the tester processor to allocate processing resources to it.

In one embodiment, the algorithmic pattern generator module 443 can be programmed to generate data on the fly. The APG module can generate incremental patterns, pseudo-random patterns or some type of constant pattern. The APG module can also have certain gating capabilities to generate test patterns with stripes, diagonal stripes or alternating patterns. In one embodiment, the APG module can use finite state machines, counters or linear feedback shift registers, among other things, to generate test patterns.

In some implementations, the APG module can be provided a starting seed as an initial value to generate more complex random patterns. As mentioned above, for example, using the sector number as a seed, the APG module will generate a reproducible sequence of any length, e.g., the length of the odd sector size. When the data needs to be read back, it can be regenerated again (using the sector address as a seed) so that it can be compared with the data read back from the DUTs in order to ensure the integrity of the DUTs.

At step 706, the instantiated FPGA block 410 communicates with the downstream port 480 to route the test pattern data to the DUTs in accordance with the commands and packet headers generated by the tester processor. The instantiated FPGA block 410, at step 708, communicates with the downstream port to read the test pattern data from the DUTs in accordance with commands generated by the tester processor. The comparator module 446 of the hardware accelerator block 440 is then used to compare the read data to the data written to the DUTs at block 710. The APG module 443 is designed in a way such that the comparator module can perform read operations on it with the same parameters that were used to generate the pseudo-random data and receive the same data that was written to the DUTs at block 704. The APG module 443 regenerates the data that was written to the DUTs on the fly and communicates it to the comparator module 446. Any mismatches are either logged on memory module 420 by the memory control module 444 or communicated by the instantiated FPGA block to the tester processor at block 712. The tester processor subsequently flags mismatches to the system controller at block 714 after receiving the error log.

I. C) Hardware Accelerator Memory Mode

Figure 8:
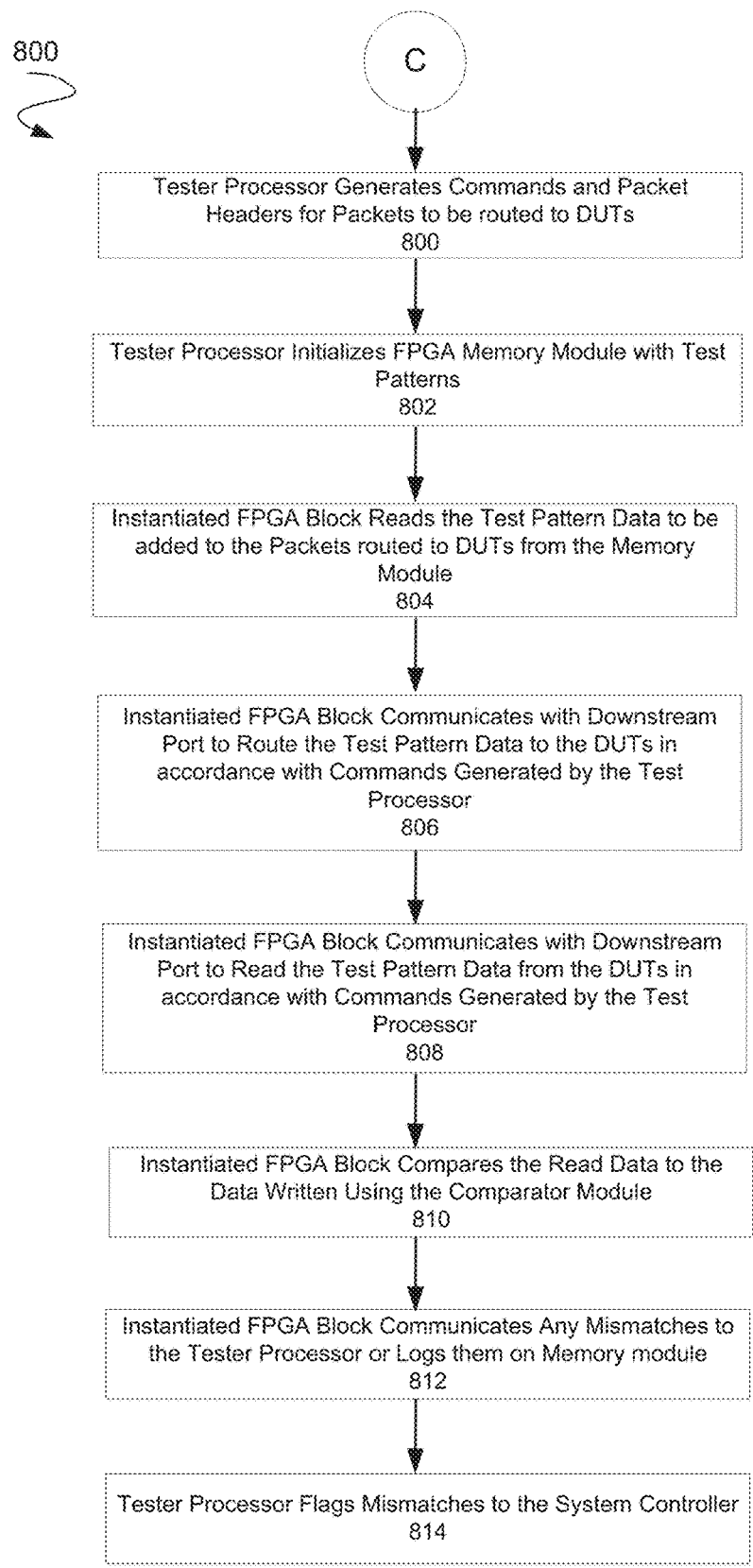
FIG. 8 is a continuation of FIG. 5 and is a flow chart of an exemplary method of testing DUTs in the hardware accelerator memory mode in one embodiment of the present invention.

FIG. 8 depicts a flowchart 800 of an exemplary process of testing DUTs in the hardware accelerator memory mode according to an embodiment of the present invention. The invention, however, is not limited to the description provided by flowchart 800. Rather, it will be apparent to persons skilled in the relevant art(s) from the teachings provided herein that other functional flows are within the scope and spirit of the present invention.

Flowchart 800 will be described with continued reference to exemplary embodiments described above in reference to FIGS. 2, 3 and 4, though the method is not limited to those embodiments.

Referring now to FIG. 8, a method of hardware acceleration is shown wherein the FPGA devices share data generation functionality so as to relieve the processing load on the tester processor 304 and the data load on system buses 330 and 332. As compared to the hardware accelerator pattern generator mode, in the hardware accelerator memory mode, the instantiated FPGA tester block accesses local memory module 420 for the data to be written to the DUTs instead of using the APG module 443.

At block 800 of the hardware accelerator pattern memory mode, the tester processor 304 generates commands and packet headers for the packets to be routed to the DUTs. The tester process retains the functionality for signaling in this mode. At block 802, the tester processor initializes the local memory module 420 of the instantiated FPGA tester block 410 with test patterns to be written out to the DUTs. One advantage of the hardware accelerator memory mode is that the test patterns generated by the tester processor may constitute real random data as opposed to pseudo-random data generated by the APG module 443 in the hardware accelerator pattern generator mode. Both the tester processor and the instantiated FPGA tester block have read and write access to the local memory module 420. However, the tester processor only accesses memory module 420 during initial set-up. During the accelerator mode, the tester processor does not access the memory module because the additional processing load on the tester processor 304 and the additional data load on the system buses 330 and 332 slows the acceleration down considerably.

At block 804, the instantiated FPGA tester block reads the test pattern data to be routed to the DUTs from the memory module 420. Because the memory module 420 is dedicated to the FPGA tester block or shared with just one other FPGA tester block, there is a high bandwidth connection between the two resulting in fast read operations. The logic block module 450 comprises functionality for routing the data generated and adding it to the packets to be written out to the DUTs.

After the data has been added to the packets, at block 806, the instantiated FPGA tester block communicates with the downstream port 480 to route the test pattern data to the DUTs in accordance with the commands and packet headers generated by the tester processor. The instantiated FPGA block 410, at step 808, communicates with the downstream port to read the test pattern data from the DUTs in accordance with commands generated by the tester processor. The comparator module 446 of the hardware accelerator block 440 is then used to compare the read data to the data written to the DUTs at block 810. Any mismatches are either logged on memory module 420 or communicated by the instantiated FPGA block to the tester processor at block 812. The tester processor subsequently flags mismatches to the system controller at block 814 after receiving the error log.

I. D) Hardware Accelerator Packet Builder Mode (FA Mode)

Figure 9:
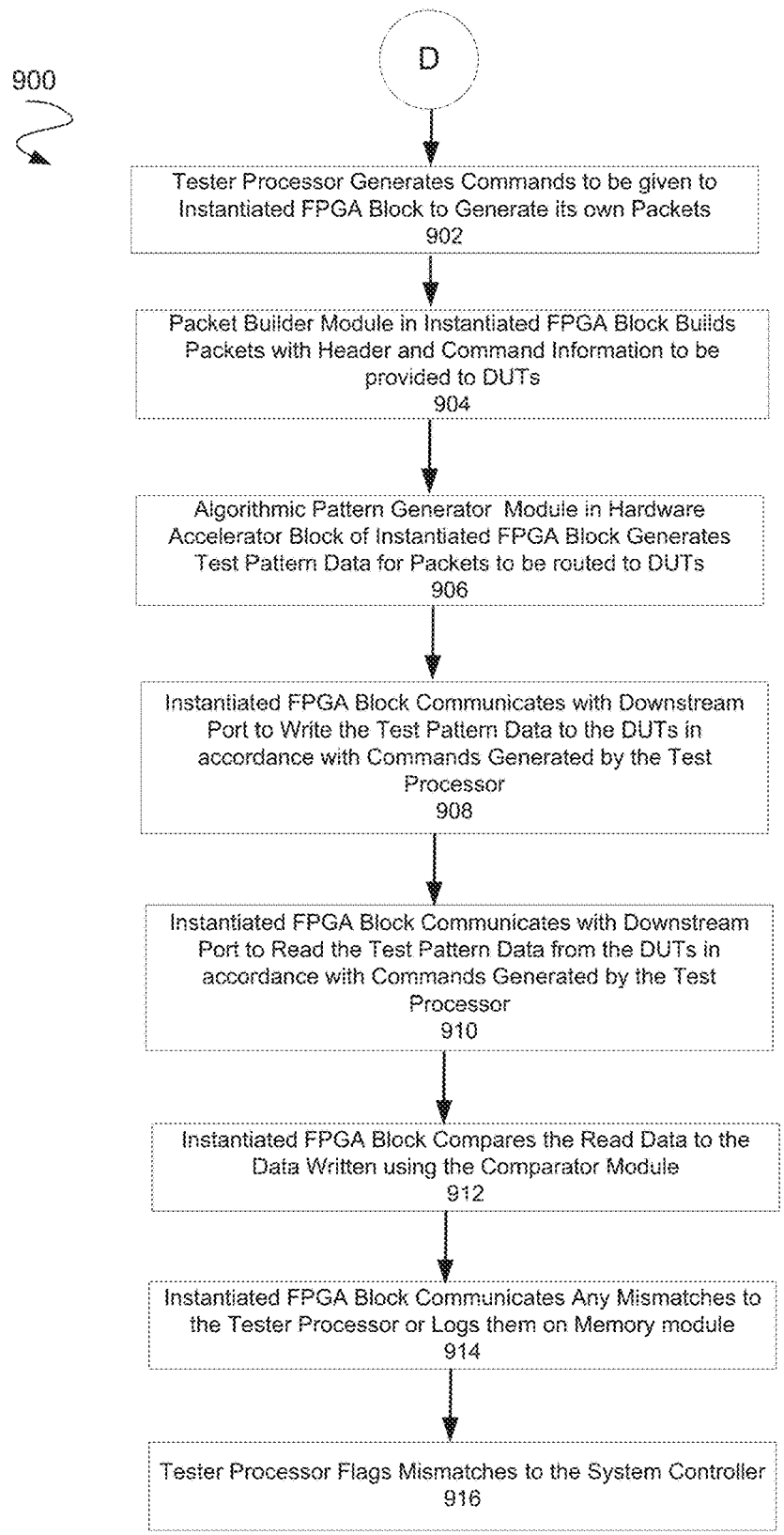
FIG. 9 is a continuation of FIG. 5 and is a flow chart of an exemplary method of testing DUTs in the hardware accelerator packet builder mode in one embodiment of the present invention.

FIG. 9 depicts a flowchart 900 of an exemplary process of testing DUTs in the hardware accelerator packet builder mode according to an embodiment of the present invention. The invention, however, is not limited to the description provided by flowchart 900. Rather, it will be apparent to persons skilled in the relevant art(s) from the teachings provided herein that other functional flows are within the scope and spirit of the present invention.

Flowchart 900 will be described with continued reference to exemplary embodiments described above in reference to FIGS. 2, 3 and 4, though the method is not limited to those embodiments Referring now to FIG. 9, a method of hardware acceleration is shown wherein the FPGA devices share both data and command generation functionality so as to relieve the processing load on the tester processor 304 and the data load on system buses 330 and 332. This mode is also known as "full acceleration" (FA) mode because most of the control for running the device tests is shifted to the FPGA devices and the tester processor 304 retains control for only commands other than reads and writes and compares.

At block 902 of the hardware accelerator packet builder mode, the tester processor 304 generates commands to be communicated to the instantiated FPGA block 410 to generate its own packets. The tester processor retains functionality for only the non read/write/compare commands in this mode. The functionality for commands such as read, write and compare operations are conveyed to the instantiated FPGA blocks. At block 904, the packet builder module 445 of the instantiated FPGA tester block builds packets with header and command information to be communicated to the DUTs. The packets comprise at least the command type, the block address of the device and the test pattern data.

The algorithmic pattern generator module 443 within the hardware accelerator block 440 generates the pseudo random test data to be written to the DUTs at block 906. The logic block module 450 comprises functionality for routing the data and commands generated by the instantiated FPGA block and consolidating them into packets to be written out to the DUTs.

At block 908, the instantiated FPGA tester block communicates with the downstream port 480 to route the test pattern data to the DUTs. The instantiated FPGA block 410, at step 910, communicates with the downstream port to read the test pattern data from the DUTs. The comparator module 446 of the hardware accelerator block 440 is then used to compare the read data to the data written to the DUTs at block 912. Any mismatches are either logged on memory module 420 or communicated by the instantiated FPGA block to the tester processor at block 914. The tester processor subsequently flags mismatches to the system controller at block 916 after receiving the error log.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. An automated test equipment (ATE) system comprising:
   a system controller communicatively coupled to a tester processor, wherein the system controller is operable to transmit instructions to the tester processor; and
   the tester processor operable to generate commands and data from the instructions for coordinating testing of a device under test (DUT), wherein the DUT supports an arbitrary sector size, and wherein software layers on the tester processor perform computations to control data flow between the tester processor and sectors of arbitrary size in the DUT, wherein the software layers comprise one or more functional layers operable to transport data between the DUT supporting the arbitrary sector size and the tester processor, and wherein the software layers comprise at least a device driver layer and an application layer.

2. The ATE system of claim 1, wherein the sectors of arbitrary size comprise all data sectors.

3. The ATE system of claim 1, wherein the system controller is operable to execute a Linux operating system.

4. The ATE system of claim 1, wherein the software layers comprise four functional layers operable to transport data between the DUT supporting the arbitrary sector size and the tester processor.

5. The ATE system of claim 1, wherein the software layers comprise four functional layers operable to transport data between the DUT supporting the arbitrary sector size and the tester processor, wherein the software layers comprise the device driver layer, a Linux block layer, a Vast System software layer and the application layer.

6. The ATE system of claim 5, wherein, in response to a command issued to the DUT by the tester processor, the Vast System Software layer is operable to determine a nearest sector size to the arbitrary sector size supported by the Linux block layer and request a computed number of blocks from the Linux block layer, and wherein the computed number of blocks includes a number of blocks requested by the tester processor in the command and additional blocks required to buffer additional bytes per arbitrary sector block.

7. The ATE system of claim 6, wherein the Linux block layer is operable to determine if a length of information requested by the Vast System Software layer meets a limitation of processing data associated with the Linux block layer, and wherein the Linux block layer is further operable to pass down the command to the device driver layer.

8. The ATE system of claim 7, wherein the device driver layer is operable determine number of sectors to be accessed from the DUT and further operable to transmit the command to the DUT.

9. The ATE system of claim 1, further comprising:
   a Field Programmable Gate Array (FPGA), wherein the tester processor is communicatively coupled to the FPGA, and wherein the FPGA comprises at least one hardware accelerator circuit operable to internally generate commands and data transparently from the tester processor for testing the DUT.

10. The ATE system of claim 9, wherein the tester processor operates in standard mode to generate the commands and data to test the DUT.

11. The ATE system of claim 5, wherein the Vast System Software layer, the device driver layer and the application layers comprise logic to detect and communicate with a DUT of arbitrary sector sizes.

12. A method of testing using an automated test equipment (ATE) comprising:
   transmitting instructions from a system controller of a computer system to a tester processor, wherein the system controller is communicatively coupled to the tester processor; and
   generating commands and data using the tester processor for coordinating testing of a device under test (DUT), wherein the DUT supports a plurality of arbitrary all-data sector sizes, and wherein software layers on the tester processor perform computations to control data flow between the tester processor and the plurality of arbitrary all-data sector sizes in the DUT, wherein the software layers comprise one or more functional layers operable to transport data between the DUT supporting the arbitrary sector size and the tester processor, and wherein the software layers comprise at least a device driver layer and an application layer.

13. The method of claim 12, wherein the system controller is operable to execute a Linux operating system.

14. The method of claim 12, wherein the software layers comprise four functional layers operable to transport data between the DUT supporting the arbitrary sector size and the tester processor.

15. The method of claim 12, wherein the software layers comprise four functional layers operable to transport data between the DUT supporting the arbitrary sector size and the tester processor, wherein the software layers comprise the device driver layer, a Linux block layer, a Vast System software layer and the application layer.

16. An automated test equipment (ATE) apparatus comprising:
a computer system comprising a system controller, wherein the system controller is communicatively coupled to a tester processor and an FPGA wherein the system controller is operable to transmit instructions to the tester processor, and wherein the tester processor is operable to generate commands and data from the instructions for coordinating testing of a device under test (DUT), wherein the DUT supports a plurality of non-standard all-data sector sizes;
wherein the FPGA is communicatively coupled to the tester processor and comprises at least one hardware accelerator circuit operable to internally generate commands and data transparently from the tester processor for testing the DUT; and
wherein the tester processor is configured to operate in one of a plurality of functional modes, wherein each functional mode is configured to allocate functionality for generating commands and for generating data between the tester processor and the FPGA in a different manner, and wherein in standard mode, the tester processor is configured to generate all commands and data for coordinating testing of the DUT comprising the plurality of non-standard all-data sector sizes, wherein software layers on the tester processor perform computations to control data flow between the tester processor and the plurality of non-standard all-data sector sizes in the DUT, and wherein the software layers comprise functional layers operable to transport data between the DUT supporting the plurality of non-standard all-data sector sizes and the tester processor.

17. The ATE apparatus of claim 16, wherein the tester processor is operable to execute a Linux operating system.

18. The ATE apparatus of claim 16, wherein the software layers comprise four functional layers operable to transport data between the DUT supporting the plurality of non-standard all-data sector sizes and the tester processor.

19. The ATE apparatus of claim 18, wherein the software layers comprise four functional layers operable to transport data between the DUT supporting the arbitrary sector size and the tester processor, wherein the software layers comprise a device driver layer, a Linux block layer, a Vast System software layer and the user application layer.

* * * * *